(12) United States Patent
Hung et al.

(10) Patent No.: US 6,365,303 B1
(45) Date of Patent: Apr. 2, 2002

(54) ELECTROSTATIC DISCHARGE DAMAGE PREVENTION METHOD ON MASKS

(75) Inventors: Chang-Cheng Hung, Hsin-Chu; Jeen-Hao Liu, Yuan-Lin; Yi-Hsu Chen, Hsin-Chu; Yung-Haw Liaw, Hsin-Chu; Dong-Hsu Cheng, Hsin-Chu; Deng-Guey Juang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/557,397

(22) Filed: Apr. 24, 2000

(51) Int. Cl.⁷ .............................. G03F 9/00; H01L 23/62
(52) U.S. Cl. ........................................... 430/5; 257/355
(58) Field of Search .......................... 430/5, 296, 322; 257/355

(56) References Cited

U.S. PATENT DOCUMENTS

| | | | |
|---|---|---|---|
| 5,403,683 A | 4/1995 | Ohta et al. ..................... 430/5 |
| 5,567,550 A | 10/1996 | Smayling ........................ 430/5 |
| 5,798,192 A | 8/1998 | King et al. ..................... 430/5 |
| 5,989,754 A | * 11/1999 | Chen et al. ..................... 430/5 |
| 6,180,291 B1 | * 1/2001 | Bessy et al. ..................... 430/5 |
| 6,265,756 B1 | * 7/2001 | Brockett et al. ............. 257/555 |

* cited by examiner

*Primary Examiner*—S. Rosasco
(74) *Attorney, Agent, or Firm*—George O. Saile; Stephen B. Ackerman; Larry J. Prescott

(57) ABSTRACT

A mask pattern having an anti-ESD ring which protects the pattern region of the mask from damage due to ESD events. The anti-ESD ring has a space between two broad border regions formed of an opaque metal such as chrome. ESD fingers, or rods extend from one of the border regions to within a small gap of the other border region. These ESD fingers act as lightning rods so that ESD events preferably occur across this small gap between the ESD fingers and one of the border regions. The ESD fingers are small enough so that any metal transferred across the gap in an ESD event is very small. The gap is located so that any metal transferred is far away from the pattern region of the mask. The ESD fingers confine ESD events to a preferred region of the mask and damage to the pattern region is avoided.

20 Claims, 7 Drawing Sheets

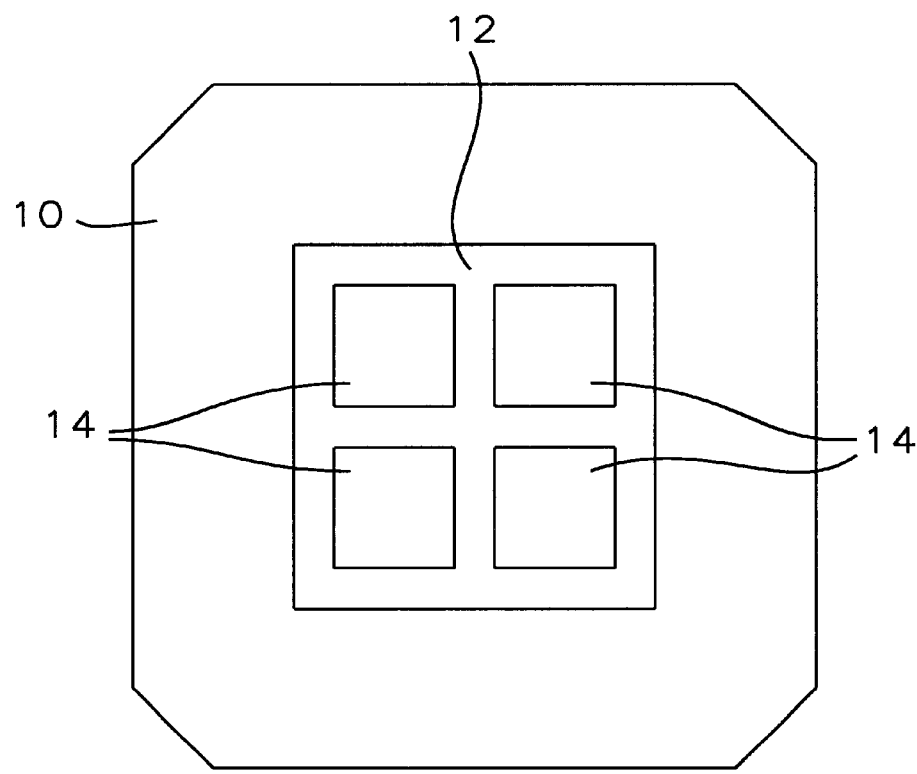
FIG. 1 – Prior Art

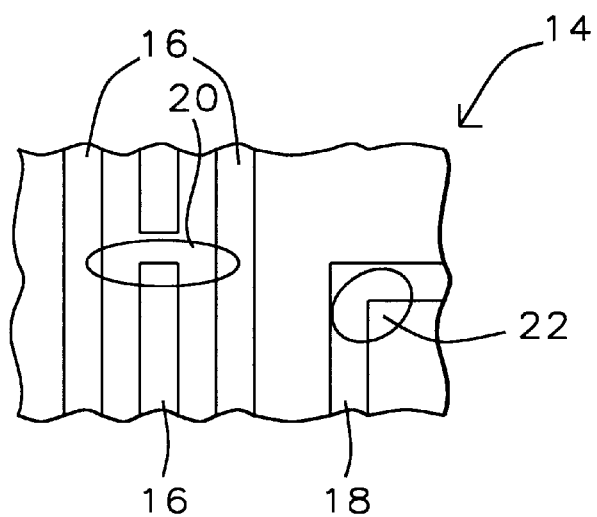
FIG. 2A – Prior Art
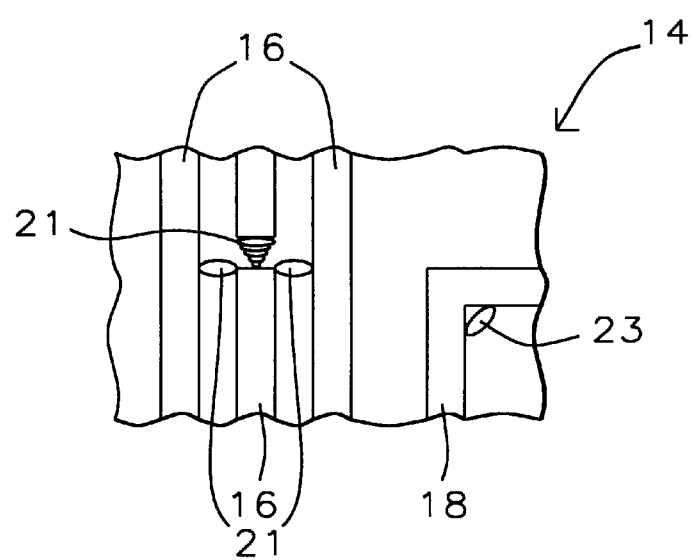
FIG. 2B – Prior Art

ELECTROSTATIC DISCHARGE DAMAGE PREVENTION METHOD ON MASKS

BACKGROUND

1. Field of the Invention

This invention relates to mask designs which control Electrostatic Discharge, ESD, and more particularly to methods of preventing mask damage due to ESD.

2. Description of the Related Art

Electrostatic Discharge, ESD, can cause considerable damage in dense integrated circuit devices. Many procedures and tools have been introduced for the specific purpose of controlling damage due to ESD. ESD damage is also an important concern for the masks used to fabricate integrated circuit devices. ESD events on a mask can distort the mask patterns which destroys the accuracy of the mask patterns. Avoiding mask damage due ESD events is an important consideration in mask design and use.

U.S. Pat. No. 5,567,550 to Smayling describes a method of making a mask for making integrated circuits. The mask is used to fabricate an integrated circuit chip which eliminates damage due to ESD on the chip.

U.S. Pat. No. 5,403,683 to Ohta et al. describes a photomask which comprises a light-permeable substrate, mask patterns formed of light-shielding films formed on the substrate, and a light-permeable protective film made of a conductive substance disposed over the surface of the substrate including the patterns formed of light-shielding films.

U.S. Pat. No. 5,798,192 to King et al. describes a mask using chrome patterns with a thin conductive layer formed over the chrome patterns to protect the chrome patterns from damage due to ESD events.

SUMMARY OF THE INVENTION

Electrostatic Discharge, ESD, damage is an important concern for the masks used to fabricate integrated circuit devices. ESD events occur when an electrostatic potential builds up on metal pattern elements until an electrical discharge from one metallic pattern element to another metallic pattern element occurs. This electric discharge can transport part of the one metallic pattern element and deposit it on another metallic pattern element or deposit metal fragments in the gap between the pattern elements which will distort the mask pattern. This distorted mask pattern can then be transferred to the integrated circuit chip fabricated using the mask.

FIG. 1 shows a top view of a conventional mask having opaque pattern elements formed on a transparent mask substrate. The opaque pattern elements are formed of a material such as chrome and the transparent mask substrate is typically quartz. The mask has a pattern region 12 surrounded by a seal ring 10 of chrome. The pattern region 12 has a number of pattern images 14 which are to be transferred to an integrated circuit wafer. As shown in FIG. 2A the pattern images 14 have a number of straight lines 16 as well as lines 18 having corners. Regions of the pattern images having spaces between lines 20 and the interior of corners 22 are particularly susceptible to damage due to ESD events. As shown in FIG. 2B ESD can leave chrome residue 21 in the region between lines 16. ESD can also leave chrome residue 23 in the interior corners of lines 18.

It is a principle objective of this invention to provide a mask design which protects the pattern regions from damage due to ESD events.

This objective is achieved by forming an anti-ESD ring around the pattern region of the mask. The anti-ESD ring has a space between two broad border regions formed of an opaque metal such as chrome. ESD fingers, or rods extend from one of the border regions to within a small gap of the other border region. These ESD fingers act as lightning rods so that ESD events preferably occur across this small gap between the ESD fingers and one of the border regions. The ESD fingers are small enough so that any metal transferred across the gap in an ESD event is very small. The gap is located so that any metal transferred is far away from the pattern region of the mask. The ESD fingers confine ESD events to a preferred region of the mask and damage to the pattern region is avoided.

The ESD fingers can also project from each of the border regions and terminate with a small gap between two of the fingers each connected to different border regions. The ESD fingers can have a rectangular tip or a special shape such as a pointed tip to aid in a quiet ESD discharge.

BRIEF DESCRIPTION OF THE DRAWINGS

FIG. 1 shows a top view of a conventional mask.

FIG. 2A shows a top view of a part of a pattern image of a mask.

FIG. 2B shows a top view of a part of a pattern image showing possible ESD damage to the pattern.

DESCRIPTION OF THE PREFERRED EMBODIMENTS

Figure 3A:
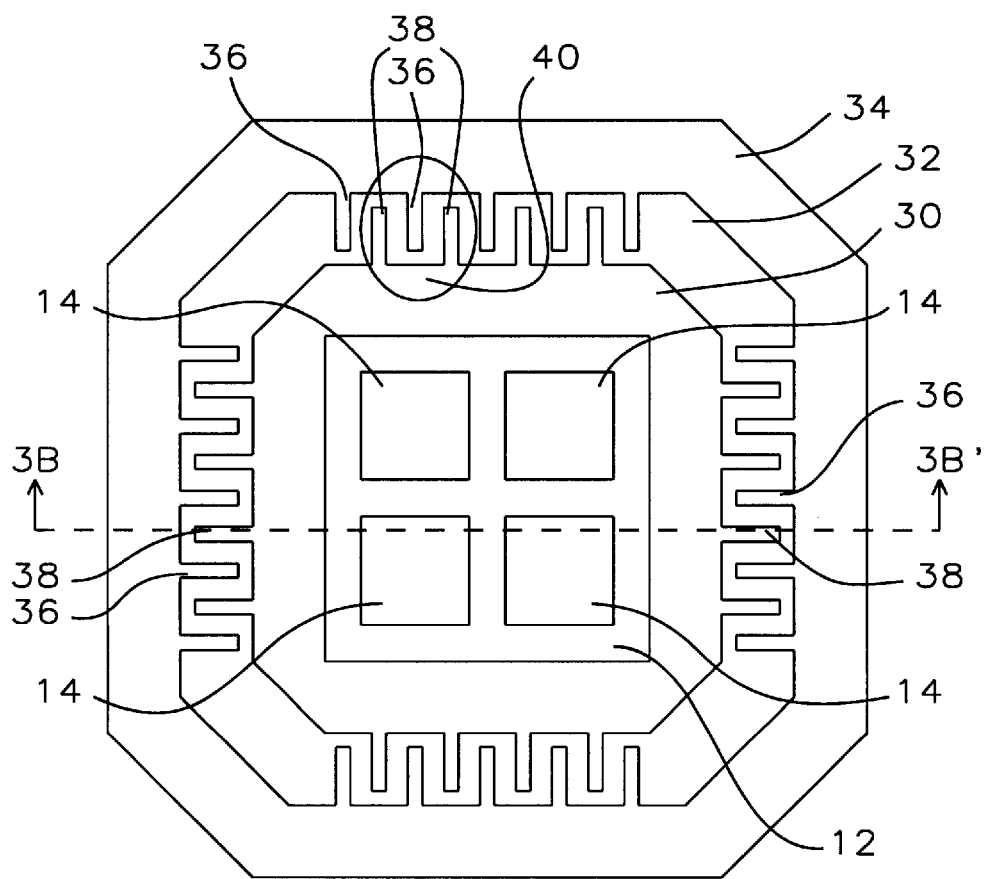
FIG. 3A shows a top view of a mask having a first type of anti-ESD ring of this invention.

Refer now to FIGS. 3A–4B for an embodiment of the anti-ESD ring of this invention. FIG. 3A shows a top view of a mask having a pattern region 12 with a number pattern images 14 in the pattern region 12. The pattern region 12 of the mask is surrounded by a first border region 30 covered by a metallic material, typically chrome. A second border region 32 surrounds the first border region. A third border region 34 surrounds the second border region 32 and is covered by a metallic material, typically chrome.

A first number of first conducting fingers 38, typically chrome, project away from the metal covering the first border region 30 into the second border region 32. One end of each of the first conducting fingers 38 makes electrical contact with the metal covering the first border region 30 of the mask. A second number of second conducting fingers 36, typically chrome, project away from the metal covering the third border region 34 into the second border region 32. One end of each of the second conducting fingers 36 makes electrical contact with the metal covering the third border region 34 of the mask.

Figure 3B:
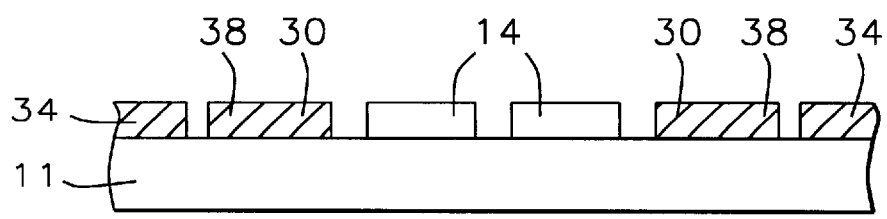
FIG. 3B shows a cross section view of the mask of FIG. 3A.

FIG. 3B shows a cross section view of the mask of FIG. 3A along the line 3B–3B'. As shown in FIG. 3B, the metal covering the first border region 30, the metal covering the third border region 34, and the first fingers 38 and second fingers 36 are formed of metal on a transparent mask substrate 11. In this example the metal is chrome and the transparent mask substrate is quartz. As shown in FIG. 3B, the pattern images 14 are formed on the transparent mask substrate 11. The detail of the pattern images 14 is not shown.

Figure 4A:
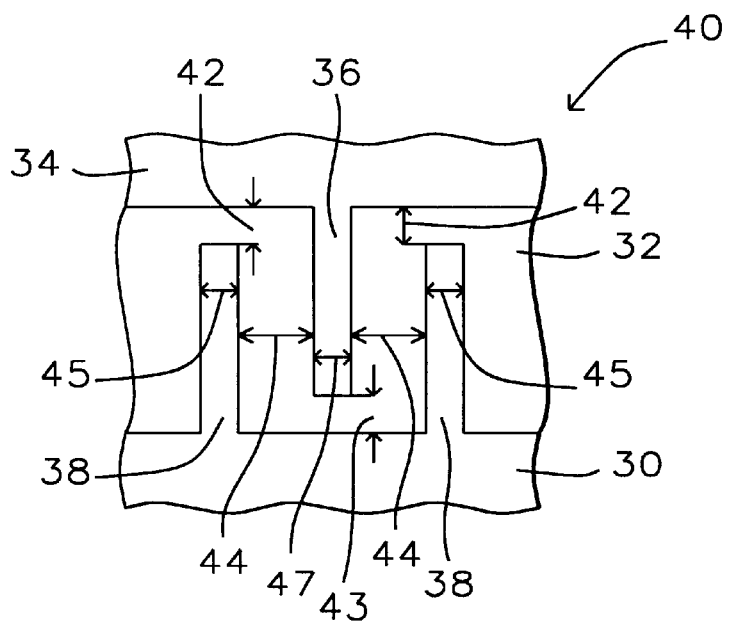
FIG. 4A shows a top view of a part of the anti-ESD ring of FIG. 3A showing ESD fingers with a rectangular tip.
Figure 4B:
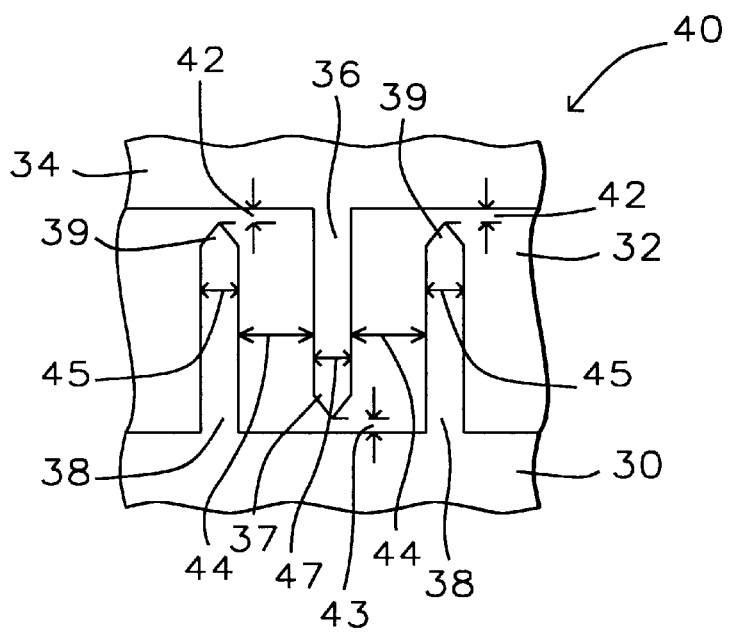
FIG. 4B shows a top view of a part of the anti-ESD ring of FIG. 3A showing ESD fingers with a pointed tip.

FIGS. 4A and 4B show the detail of the first fingers 38 and the second fingers 36. FIGS. 4A and 4B show a detail view of the region of the mask of FIG. 3A identified by reference number 40. As shown in FIGS. 4A and 4B the first fingers 38 make electrical contact with the metal covering the first border region 30 and are a first distance 42 away from the metal covering the third border region 34. The second fingers 36 make electrical contact with the metal covering the third border region 34 and are a second distance 43 away from the metal covering the first border region 30. The first distance 42 and the second distance 43 are between about 1 and 3 microns.

The first fingers 38 have a first width 47, between about 1 and 3 microns. The second fingers 36 have a second width 47, between about 1 and 3 microns. As shown in FIGS. 4A and 4B, each of the first fingers 38 is disposed adjacent to and parallel to one of the second fingers 36.

As shown in FIG. 4A the first fingers 38 can have a rectangular end adjacent to the metal covering the third border region 34 and the second fingers 36 can have a rectangular end adjacent to the metal covering the first border region 30. As shown in FIG. 4B the first fingers 38 can have a pointed end adjacent to the metal covering the third border region 34 and the second fingers 36 can have a pointed end adjacent to the metal covering the first border region 30.

The metal covering the first border region 30, the conducting first fingers 38, the conducting second fingers 36, and the metal covering the third border region 34 constitute an anti-ESD ring which protects the pattern region of the mask from ESD damage. The distances are adjusted so that any ESD events occur between the conducting first fingers 38 and the metal covering the third border region 34 or between the conducting second fingers 36 and the metal covering the first border region 30, thereby protecting the pattern region of the mask from ESD damage.

Figure 5A:
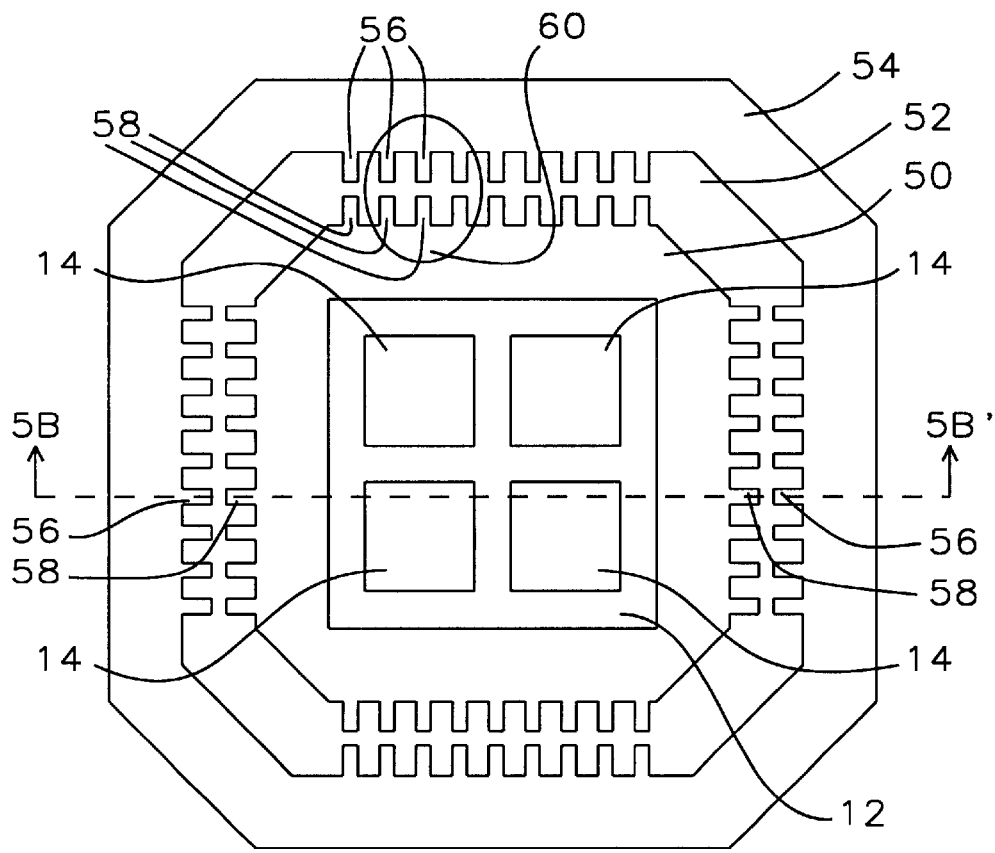
FIG. 5A shows a top view of a mask having a second type of anti-ESD ring of this invention.

Refer now to FIGS. 5A–6B for another embodiment of the anti-ESD ring of this invention. FIG. 5A shows a top view of a mask having a pattern region 12 with a number pattern images 14 in the pattern region 12. The pattern region 12 of the mask is surrounded by a first border region 50 covered by a metallic material, typically chrome. A second border region 52 surrounds the first border region. A third border region 54 surrounds the second border region 52 and is covered by a metallic material, typically chrome.

A first number of first conducting fingers 58, typically chrome, project away from the metal covering the first border region 50 into the second border region 52. One end of each of the first conducting fingers 58 makes electrical contact with the metal covering the first border region 50 of the mask. A second number of second conducting fingers 56, typically chrome, project away from the metal covering the third border region 54 into the second border region 52. One end of each of the second conducting fingers 56 makes electrical contact with the metal covering the third border region 54 of the mask.

Figure 5B:
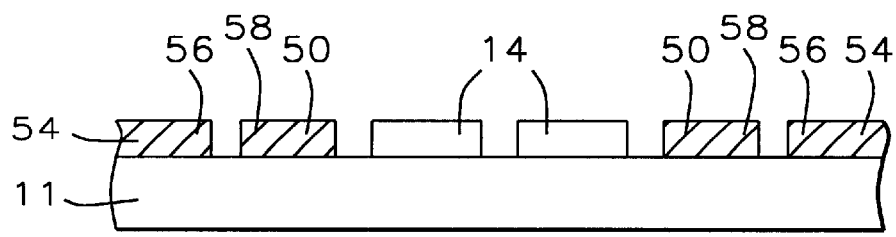
FIG. 5B shows a cross section view of the mask of FIG. 5A.

FIG. 5B shows a cross section view of the mask of FIG. 5A along the line 5B–5B'. As shown in FIG. 5B, the metal covering the first border region 50 and the metal covering the third border region 54 are formed on a transparent mask substrate 11. The first fingers 58 and the second fingers 56 are formed of metal on the transparent mask substrate 11. In this example the metal is chrome and the transparent mask substrate is quartz. As shown in FIG. 5B, the pattern images 14 are formed on the transparent mask substrate 11. The detail of the pattern images 14 is not shown.

Figure 6A:
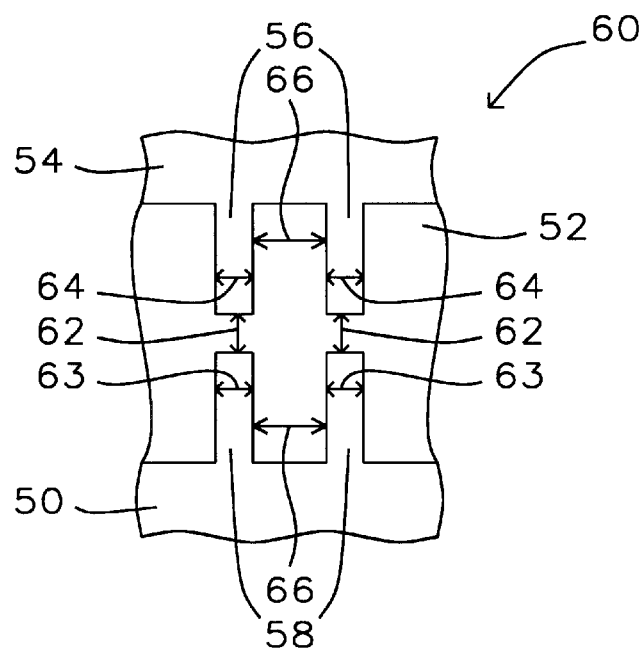
FIG. 6A shows a top view of a part of the anti-ESD ring of FIG. 5A showing ESD fingers with a rectangular tip.
Figure 6B:
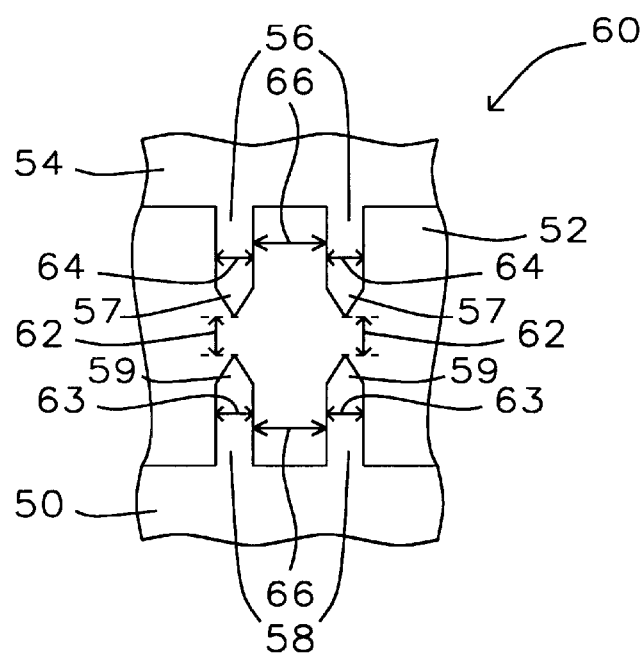
FIG. 6B shows a top view of a part of an anti-ESD ring of FIG. 5A showing ESD fingers with a pointed tip.

FIGS. 6A and 6B show the detail of the first fingers 58 and the second fingers 56. FIGS. 6A and 6B show a detail view of the region of the mask of FIG. 5A identified by reference number 60. As shown in FIGS. 6A and 6B, the first fingers 58 make electrical contact with the metal covering the first border region 50 and the second fingers 56 make electrical contact with the metal covering the third border region 54. The first fingers 58 and the second fingers 56 are disposed so that they extend into the second border region 52 and one of the first fingers 58 is on a line with one of the second fingers 58 with a first distance 62 between their tips. The first distance 62 is between about 1 and 3 microns. The first fingers 58 have a first width 63, between about 1 and 3 microns. The second fingers 56 have a second width 64, between about 1 and 3 microns. As shown in FIG. 6A the nearest ends of the first fingers 58 and second fingers 56 can be rectangular. As shown in FIG. 6B the nearest ends of the first fingers 58 and second fingers 56 can be pointed.

The metal covering the first border region 30, the conducting first fingers 58, the conducting second fingers 56, and the metal covering the third border region 54 constitute an anti-ESD ring which protects the pattern region of the mask from ESD damage. The distances are adjusted so that any ESD events occur between the conducting first fingers 58 and conducting second fingers 56, thereby protecting the pattern region of the mask from ESD damage.

Figure 7A:
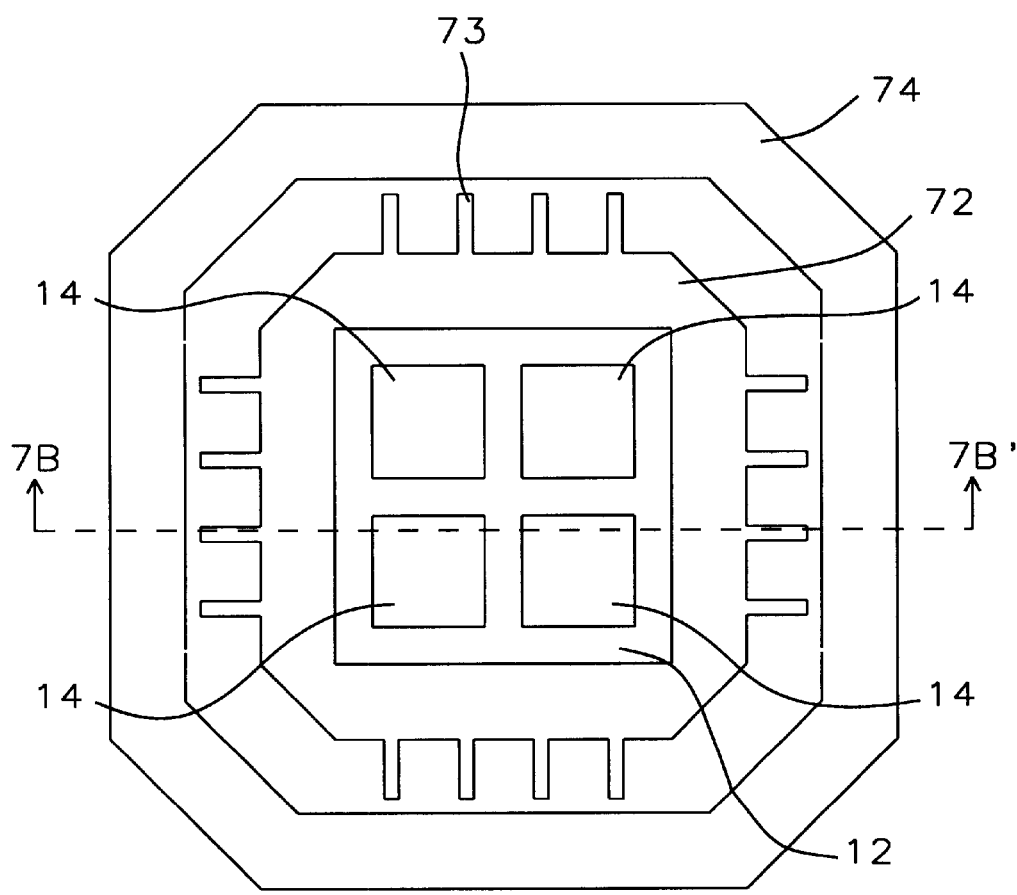
FIG. 7A shows a top view of a mask having a third type of anti-ESD ring of this invention.
Figure 7B:
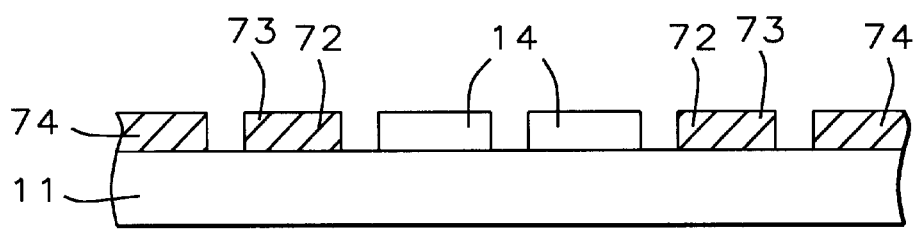
FIG. 7B shows a cross section view of the mask of FIG. 7A.

Refer now to FIGS. 7A–7B for another embodiment of the anti-ESD ring of this invention. FIG. 7A shows a top view of a mask having a pattern region 12 with a number pattern images 14 in the pattern region 12. The pattern region 12 of the mask is surrounded by a first border region 72 covered by a metallic material, typically chrome. A second border region 75 surrounds the first border region. A third border region 74 surrounds the second border region 75 and is covered by a metallic material, typically chrome.

A number of conducting fingers 73, typically chrome, project away from the metal covering the first border region 72 into the second border region 75. One end of each of the first conducting fingers 73 makes electrical contact with the metal covering the first border region 72 of the mask. The conducting fingers 73 extend close to the metal covered third border region 74 and form a region for discharges to prevent the buildup of high electrostatic potential between the metal covered first border region 72 and metal covered third border region 74.

FIG. 7B shows a cross section view of the mask of FIG. 7A along the line 7B–7B'. As shown in FIG. 7B, the metal covering the first border region 72, the metal covering the third border region 74, and the fingers 73 are formed of metal on a transparent mask substrate 11. In this example the metal is chrome and the transparent mask substrate is quartz. As shown in FIG. 7B, the pattern images 14 are formed on the transparent mask substrate 11. The detail of the pattern images 14 is not shown.

While the invention has been particularly shown and described with reference to the preferred embodiments thereof, it will be understood by those skilled in the art that various changes in form and details may be made without departing from the spirit and scope of the invention.

What is claimed is:

1. A mask, comprising:
   a transparent mask substrate having a pattern region, a first border region surrounding said pattern region, a second border region surrounding said first border region, and a third border region surrounding said second border region;
   a layer of conducting metal formed on the entire said first border region of said transparent mask substrate;
   a layer of said conducting metal formed on the entire said third border region of said transparent mask substrate;
   a first number of first conducting fingers formed of said conducting metal on said second border region of said transparent mask substrate, wherein each of said first conducting fingers has a first width, a first end in electrical contact with said conducting metal formed on said first border region of said transparent mask substrate, and a second end a first distance away from said conducting metal formed on said third border region of said transparent mask substrate; and
   a second number of second conducting fingers formed of said conducting metal on said second border region of said substrate, wherein each of said second conducting fingers has a second width, a first end in electrical contact with said conducting metal formed on said third border region of said transparent mask substrate, a second end a second distance away from said conducting metal formed on said first border region of said transparent mask substrate, and each of said second conducting fingers is disposed parallel to and adjacent to one of said first conducting fingers.

2. The mask of claim 1 wherein said conducting metal is chromium.

3. The mask of claim 1 wherein said transparent mask substrate is quartz.

4. The mask of claim 1 wherein said first distance is between about 1 and 3 microns.

5. The mask of claim 1 wherein said second distance is between about 1 and 3 microns.

6. The mask of claim 1 wherein said first width is between about 1 and 3 microns.

7. The mask of claim 1 wherein said second width is between about 1 and 3 microns.

8. The mask of claim 1 wherein said second end of each of said first fingers and said second end of each of said second fingers have a rectangular shape.

9. The mask of claim 1 wherein said second end of each of said first fingers and said second end of each of said second fingers have a pointed shape.

10. A mask, comprising:
    a transparent mask substrate having a pattern region, a first border region surrounding said pattern region, a second border region surrounding said first border region, and a third border region surrounding said second border region;
    a layer of conducting metal formed on the entire said first border region of said transparent mask substrate;
    a layer of said conducting metal formed on the entire said third border region of said transparent mask substrate;
    a first number of first conducting fingers formed of said conducting metal on said second border region of said transparent mask substrate, wherein each of said first conducting fingers has a first width, a first end in electrical contact with said conducting metal formed on said first border region of said transparent mask substrate, and a second end; and
    said first number of second conducting fingers formed of said conducting metal on said second border region of said substrate, wherein each of said second conducting fingers has a second width, a first end in electrical contact with said conducting metal formed on said third region of said transparent mask substrate, and forms a pair with one of said first conducting fingers so that the second conducting finger of each pair is disposed in line with the first conducting fingers of that pair, and said second end of said second conducting finger in a pair is a first distance away from said second end of said first conducting finger in that pair.

11. The mask of claim 10 wherein said conducting metal is chromium.

12. The mask of claim 10 wherein said transparent mask substrate is quartz.

13. The mask of claim 10 wherein said first distance is between about 1 and 3 microns.

14. The mask of claim 10 wherein said first width is between about 1 and 3 microns.

15. The mask of claim 10 wherein said second width is between about 1 and 3 microns.

16. The mask of claim 10 wherein said second end of each of said first fingers and said second end of each of said second fingers have a rectangular shape.

17. The mask of claim 10 wherein said second end of each of said first fingers and said second end of each of said second fingers have a pointed shape.

18. A mask, comprising:
    a transparent mask substrate having a pattern region, a first border region surrounding said pattern region, a second border region surrounding said first border region, and a third border region surrounding said second border region;
    a layer of conducting metal formed on the entire said first border region of said transparent mask substrate;
    a layer of said conducting metal formed on the entire said third border region of said transparent mask substrate;
    a number of conducting fingers formed of said conducting metal on said second border region of said transparent mask substrate, wherein each of said conducting fingers has a width, a first end in electrical contact with said conducting metal formed on said first border region of said transparent mask substrate, and a second end a first distance away from said conducting metal formed on said third border region of said transparent mask substrate.

19. The mask of claim 18 wherein said conducting metal is chromium.

20. The mask of claim 18 wherein said transparent mask substrate is quartz.

* * * * *